United States Patent
Yang et al.

(10) Patent No.: US 10,998,383 B2
(45) Date of Patent: May 4, 2021

(54) DISPLAY PANELS AND DEVICES THEREOF

(71) Applicants: Kunshan New Flat Panel Display Technology Center Co., Ltd., Kunshan (CN); KunShan Go-Visionox Opto-Electronics Co., Ltd., Kunshan (CN)

(72) Inventors: Xiaolong Yang, Kunshan (CN); Rubo Xing, Kunshan (CN); Liwei Ding, Kunshan (CN)

(73) Assignees: Kunshan New Flat Panel Display Technology Center Co., Ltd., Kunshan (CN); KunShan Go-Visionox Opto-Electronics Co., Ltd., Kunshan (CN)

( * ) Notice: Subject to any disclaimer, the term of this patent is extended or adjusted under 35 U.S.C. 154(b) by 44 days.

(21) Appl. No.: 16/553,853

(22) Filed: Aug. 28, 2019

(65) Prior Publication Data
US 2019/0386073 A1    Dec. 19, 2019

Related U.S. Application Data

(63) Continuation of application No. PCT/CN2018/088756, filed on May 28, 2018.

(30) Foreign Application Priority Data

Jan. 31, 2018    (CN) .......................... 201820170407.2

(51) Int. Cl.
*H01L 27/32*    (2006.01)
*G02B 27/10*    (2006.01)

(52) U.S. Cl.
CPC .......... *H01L 27/3218* (2013.01); *G02B 27/10* (2013.01); *H01L 27/3225* (2013.01)

(58) Field of Classification Search
CPC . H01L 27/3218; H01L 27/3225; G02B 27/10; G02B 27/1006
See application file for complete search history.

(56) References Cited

U.S. PATENT DOCUMENTS

| | | | |
|---|---|---|---|
| 2012/0235884 A1 | 9/2012 | Miller et al. | |
| 2018/0024355 A1 | 1/2018 | Gao et al. | |

FOREIGN PATENT DOCUMENTS

| | | | |
|---|---|---|---|
| CN | 105404005 A | 3/2016 | |
| CN | 105629474 A | 6/2016 | |

(Continued)

OTHER PUBLICATIONS

Machine Translation of WO 2017152710; Huang, Q. and Zhou, X; Chengdu IdealSee Technology Co.; Sep. 14, 2017. (Year: 2017).*

(Continued)

*Primary Examiner* — Stephen W Smoot
*Assistant Examiner* — Vicki B. Booker
(74) *Attorney, Agent, or Firm* — Maier & Maier, PLLC

(57) ABSTRACT

The disclosure discloses a display panel. The display panel includes an optical assembly, a blue-light OLED light source assembly, a red-light OLED light source assembly and a green-light OLED light source assembly, and the optical assembly includes a beam splitting prism. The blue-light OLED light source assembly, the red-light OLED light source assembly and the green-light OLED light source assembly are arranged at three sides of the beam splitting prism, respectively. And blue light emitted by the blue-light OLED light source assembly, red light emitted by the red-light OLED light source assembly and green light emitted by the green-light OLED light source assembly are emitted through the optical assembly. The disclosure also discloses a display device and a head-mounted display device.

7 Claims, 1 Drawing Sheet

(56) References Cited

FOREIGN PATENT DOCUMENTS

| CN | 205450454 U | 8/2016 | | |
|----|-------------|--------|---|---|
| CN | 205485073 U | 8/2016 | | |
| CN | 106444250 A | 2/2017 | | |
| CN | 106707668 A | 5/2017 | | |
| CN | 107092156 A | 8/2017 | | |
| WO | WO-2017152710 A1 * | 9/2017 | ........... | G03H 1/2294 |

OTHER PUBLICATIONS

International Search Report dated Oct. 10, 2018 in corresponding International Application No. PCT/CN2018/088756; 7 pages.

* cited by examiner

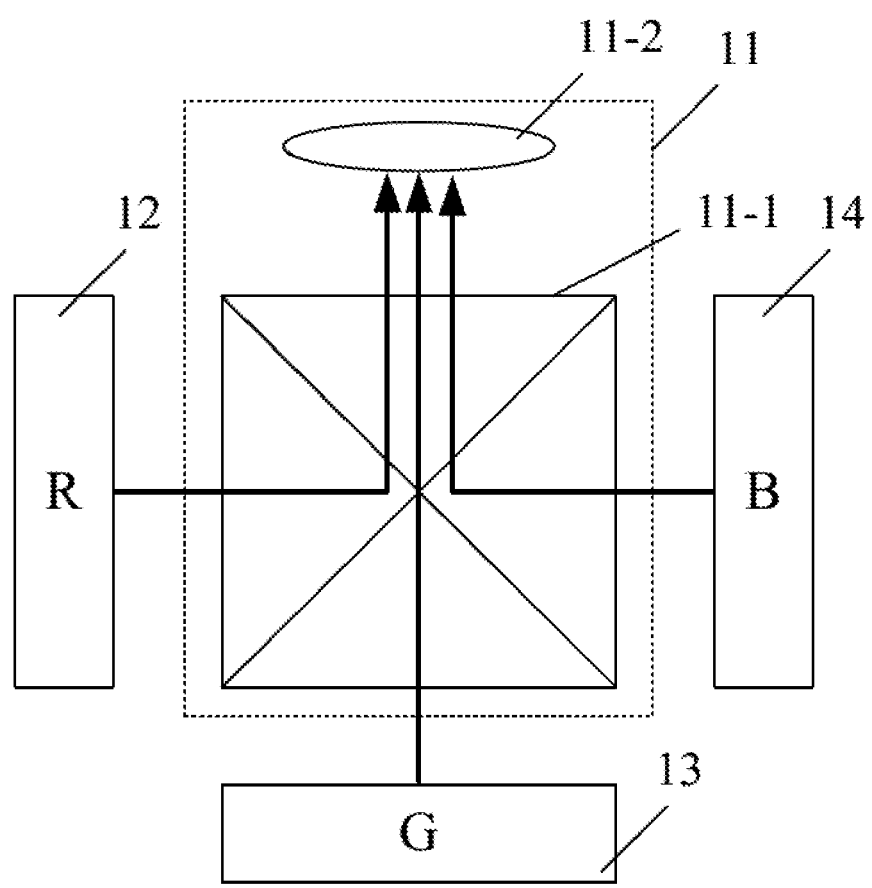

DISPLAY PANELS AND DEVICES THEREOF

CROSS-REFERENCE TO RELATED APPLICATIONS

This application is a continuation of International Patent Application No. PCT/CN2018/088756, filed on May 28, 2018, which claims the priority of Chinese Patent Application No. 201820170407.2 filed on Jan. 31, 2018, entitled "DISPLAY PANELS AND DEVICES THEREOF", the entire contents of which are hereby incorporated by reference.

FIELD

The disclosure relates to the field of display technology.

BACKGROUND

With the rapid development of display technology, Organic Light-Emitting Diode (OLED) micro-display modules are gradually applied to head-mounted display devices, such as Augmented Reality (AR), Virtual Reality (VR) and Mixed Reality (MR) and the like.

SUMMARY

Exemplary embodiments of the disclosure provide display panels for solving the problem of larger light loss.

The exemplary embodiments of the disclosure adopt the following technical solutions:

A display panel, including: an optical module, a blue-light OLED light source module, a red-light OLED light source module and a green-light OLED light source module, and the optical module comprising a beam splitting prism;
the blue-light OLED light source module, the red-light OLED light source module and the green-light OLED light source module being arranged at three sides of the beam splitting prism, respectively;
blue light emitted by the blue-light OLED light source module, red light emitted by the red-light OLED light source module and green light emitted by the green-light OLED light source module being emitted through the optical module.

Preferably, the blue light emitted by the blue-light OLED light source module, the red light emitted by the red-light OLED light source module and the green light emitted by the green-light OLED light source module being emitted through the optical module comprises:
the blue light emitted by the blue-light OLED light source module, the red light emitted by the red-light OLED light source module and the green light emitted by the green-light OLED light source module being aggregated and emitted via the same side of the beam splitting prism, and reflected and amplified by optical elements in the optical module and then emitted.

Preferably, the materials of the blue-light OLED light source module, the red-light OLED light source module and the green-light OLED light source module is a silicon-based OLED.

Preferably, the silicon-based OLED comprises a single crystal silicon substrate, an integrated drive circuit located at one side of the substrate and an OLED light-emitting layer located at the side of the integrated drive circuit far away from the substrate.

Preferably, the green-light OLED light source module is arranged at the side opposite to light-exiting side of the beam splitting prism, and the blue-light OLED light source module and the red-light OLED light source module are correspondingly arranged at two sides of the light-exiting side, respectively; the light-exiting side emits blue light, red light and green light, respectively.

Preferably, diagonal lengths of a display area of the blue-light OLED light source module, the display area of the red-light OLED light source module and the display area of the green-light OLED light source module each are less than or equal to 5 cm.

The exemplary embodiments of the disclosure further provide a display device for solving the problem of larger light loss caused by the generation of color light by combining WOLED and CF in the OLED display screens in the prior art.

The exemplary embodiments of the disclosure adopt the following technical solutions:
a display device comprising the above display panel.

The exemplary embodiments of the disclosure further provide a head-mounted display device for solving the problem of larger light loss caused by the generation of color light by combining WOLED and CF in the OLED display screens in the prior art.

The exemplary embodiments of the disclosure adopt the following technical solutions:
a head-mounted display device comprises the above display panel.

Preferably, the head-mounted display device is AR glasses; the optical module is arranged on a frame of the AR glasses; the display panel comprises: an optical module, a blue-light OLED light source module, a red-light OLED light source module, and a green-light OLED light source module; the optical module comprising a beam splitting prism;
blue light emitted by the blue-light OLED light source module, red light emitted by the red-light OLED light source module and green light emitted by the green-light OLED light source module are emitted through the optical module.

The above at least one technical solution adopted by the exemplary embodiments of the disclosure can achieve the following beneficial effects:

Since the touch display panel provided by the disclosure comprises the blue-light OLED light source module, the red-light OLED light source module and the green-light OLED light source module, and the blue-light OLED light source module, the red-light OLED light source module and the green-light OLED light source module are arranged at three sides of the beam splitting prism in the optical module, respectively. And a full-color OLED display screen is generated by combining a three primary color light source with the beam splitting prisms, thereby greatly reducing light loss and avoiding the problem of larger light loss caused by the generation of color light by combining WOLED and CF in OLED display screens. In addition, since the optical module further comprises an optical element for amplifying and reflecting, the red, blue and green light emitted by the beam splitting prism can be amplified and reflected by the optical module to project the emitted image into the human eyes.

BRIEF DESCRIPTION OF THE DRAWINGS

The drawings described herein are provided for further understanding the disclosure and as a part of the disclosure. The exemplary embodiments of the disclosure and description thereof are used to explain the disclosure and not as any improper limitation to the disclosure. In the drawings:

FIG. 1 is a schematic structural view of an embodiment of a display panel provided by an exemplary embodiment of the disclosure.

DETAILED DESCRIPTION OF PREFERRED EXEMPLARY EMBODIMENTS

At present, the OLED micro-display module often fabricates a semiconductor integrated drive circuit and White Organic Light-Emitting Diode (WOLED) on a single crystal silicon, and processes a Color Filter (CF) on a separate glass substrate. A full-color OLED display screen can be realized by combining the white organic light-emitting diode with the color filter.

In the above scene, since white light emitted by the white organic light-emitting diode passes through the color filter to generate a certain color, such as green light, red light and blue light in the white light are filtered out through a green color filter, which will result in larger light loss.

In order to make the purposes, technical solutions and advantages of the disclosure clearer, the technical solutions of the disclosure will be clearly and completely described below with reference to the specific exemplary embodiments and the corresponding drawings. It is apparent that the described exemplary embodiments are merely part of the exemplary embodiments of the disclosure rather than all the exemplary embodiments. Based on the exemplary embodiments in the disclosure, all the other exemplary embodiments obtained by a person skilled in the art without paying creative work will fall into the protection scope of the disclosure.

The technical solutions provided by exemplary embodiments of the disclosure are described in detail below in conjunction with the accompanying drawings.

The disclosure provides a display panel, comprising an optical module, a blue-light OLED light source module, a red-light OLED light source module and a green-light OLED light source module. The optical module comprises a beam splitting prism; wherein the blue-light OLED light source module, the red-light OLED light source module and the green-light OLED light source module are arranged at three sides of the beam splitting prism, respectively; blue light emitted by the blue-light OLED light source module, red light emitted by the red-light OLED light source module and green light emitted by the green-light OLED light source module are emitted through the optical module.

Since the touch display panel provided by the disclosure comprises the blue-light OLED light source module, the red-light OLED light source module and the green-light OLED light source module, and the blue-light OLED light source module, the red-light OLED light source module and the green-light OLED light source module are arranged at three sides of the beam splitting prism in the optical module, respectively, and a full-color OLED display screen is generated by combining a three primary color light source with the beam splitting prisms, thereby greatly reducing light loss and avoiding the problem of larger light loss caused by the generation of color light by combining WOLED and CF in OLED display screens in the prior art. In addition, since the optical module further comprises an optical element for amplifying and reflecting, the red, blue and green light emitted by the beam splitting prism can be amplified and reflected by the optical module to project the emitted image into the human eyes.

On the basis that the core concept of the display panel provided by the disclosure is briefly described, the concept of the disclosure will be described in detail below through specific exemplary embodiments.

As described above, with the development of OLED micro-displays in recent years, the OLED micro-displays are increasingly applied to head-mounted video or picture players, such as a head-mounted home theater, a head-mounted virtual reality simulator, a head-mounted game machine, a pilot helmet system, an individual combat system, an infrared night-vision instrument and a head-mounted medical diagnostic system. Since the OLED micro-display is applied to the head-mounted devices, that is, it can be in direct contact with and be close to the human eyes, the light intensity of light emitted by the OLED micro-display is required to be within an acceptable range by the human eyes, and if too weak, it is unfavorable for viewing, and if too strong, it will cause greater damage to the human eyes.

However, due to larger light loss caused by the generation of color light by combining WOLED and CF in the OLED micro-display in the prior art, in order to compensate for the light loss caused by white light emitted by the white light OLED passing through the CF, the light intensity of the white light emitted by the white light OLED may be increased. If the light intensity of the white light emitted by the white light OLED is strong, it will damage the life of the white light OLED device and reduce its reliability. At present, in the AR head-mounted display device, since the human eyes is required to compete with ambient light, the light intensity accepted by the human eyes is often about 1000 nits so that the light intensity of the OLED micro-display screen for generating color light by combining the white light OLED with CF will need to reach 10,000~40000 nits. Display light with such high intensity will cause the life of the existing OLED micro-display to be greatly damaged, which greatly reduces the reliability, so that it is difficult to be applied into the head-mounted display devices such as AR.

In order to solve the above problem, the exemplary embodiments of the disclosure causes a three primary color light source to pass through a beam splitting prism to concentrate and form color light, thereby reducing light loss. Since CF is not used to obtain color light, large amounts of light loss caused by the light source passing through the CF can be avoided, the light intensity of light emitted by the OLED micro-display can be reduced and the service life of the OLED micro-display can be prolonged. Wherein, the beam splitting prism in the exemplary embodiments of the disclosure can be an X-Cube beam splitting prism in the practical application.

With reference to FIG. 1, FIG. 1 is a schematic structural view of an embodiment of a display panel provided by an exemplary embodiment of the disclosure, comprising an optical module (or called an optical assembly) 11, a blue-light organic light-emitting diode OLED light source module (or called a blue-light organic light-emitting diode OLED light source assembly) 14, a red-light OLED light source module (or called a red-light OLED light source assembly) 12, and a green-light OLED light source module (or called a green-light OLED light source assembly) 13. The optical module 11 comprises a beam splitting prism 11-1; wherein, the blue-light OLED light source module 14, the red-light OLED light source module 12 and the green-light OLED light source module 13 are arranged at three sides of the beam splitting prism 11-1, respectively. Blue light emitted by the blue-light OLED light source module 14, red light emitted by the red-light OLED light source module 12 and green light emitted by the green-light OLED light source module 13 are emitted through the optical module 11.

Specifically, the blue light emitted by the blue-light OLED light source module 14, the red light emitted by the red-light OLED light source module 12 and the green light emitted by the green-light OLED light source module 13 may first be aggregated and emitted via the same side of the beam splitting prism 11-1, then reflected and amplified by other optical elements 11-2 in the optical module 11 and then emitted. Thus, when the display panel is applied to head-mounted display devices, such as AR glasses, the blue light emitted by the blue-light OLED light source module 14, the red light emitted by the red-light OLED light source module 12 and the green light emitted by the green-light OLED light source module 13 are aggregated and emitted via the same side of the beam splitting prism 11-1, thus an image can be aggregated and formed here. Since the projected image is often small, light can pass through the other optical elements 11-2 in the optical module 11 in order to achieve the augmented reality effect, the light is reflected and amplified, then projected into the retina of the human eyes.

Since a silicon-based OLED can meet the requirements for the micro-display, that is, the process level thereof can reach a level of the micro-display, and a fine level thereof can be achieved, thus the materials of the blue-light OLED light source module, the red-light OLED light source module and the green-light OLED light source module in the exemplary embodiment of the disclosure may be the silicon-based OLED. The silicon-based OLED light source module includes a single crystal silicon substrate, an integrated drive circuit located at one side of the substrate, and an OLED light-emitting layer located at the side of the integrated drive circuit far away from the substrate. Specifically, the semiconductor integrated drive circuit is fabricated at one side of the substrate by a manufacturing process, and the OLED light-emitting layer is evaporated at the side of the semiconductor integrated drive circuit far away from the substrate.

In practical applications, since the light intensity of the green light is greater than that of the red light and the blue light in the three primary color consisting of red, blue and green, in the exemplary embodiment of the disclosure, the green-light OLED light source module is arranged at the side opposite to a light-existing side of the beam splitting prism, and the blue-light OLED light source module and the red-light OLED light source module are arranged at two sides of the light-existing side, respectively, and the light-existing side of the beam splitting prism emits blue light, red light and green light, respectively. Since the light sources of three colors consisting of red light, blue light and green light are required in the exemplary embodiment of the disclosure, the light sources of the three colors can be arranged based on the manner shown in FIG. 1, and due to the larger light intensity of the green light, the light path through which the green light passes can be transmitted twice, that is, two light losses, while the light intensity of the red light and blue light are relatively weak, the light path through which the red light and blue light pass can be only reflected once, i.e., only one light loss.

The display panel provided by the exemplary embodiments of the disclosure can be applied to the field of micro-display application, such as AR, VR or MR, and more specifically, the display panel is often arranged in head-mounted display devices, such as smart glasses device, thus the size of the display panel needs to be smaller than a certain value. If the value is too large, the head-mounted display device carrying the display panel is arranged largely, which not only increases the weight and volume of the head-mounted display device, but also affects the appearance of the head-mounted display device, and moreover, people tend to select a product with a smaller volume and a lower weight when selecting the similar products to make it easier to wear. Therefore, in order to allow the display panel to have practical application value and economic benefit, diagonal lengths of a display area of the blue-light OLED light source module, the display area of the red-light OLED light source module and the display area of the green-light OLED light source module in the exemplary embodiment of the disclosure are less than or equal to 5 cm.

Since the touch display panel provided by the disclosure comprises the blue-light OLED light source module, the red-light OLED light source module and the green-light OLED light source module, and the blue-light OLED light source module, the red-light OLED light source module and the green-light OLED light source module are arranged at three sides of the beam splitting prism in the optical module, respectively, and a full-color OLED display screen is generated by combining a three primary color light source with the beam splitting prisms, thereby greatly reducing light loss and avoiding the problem of larger light loss caused by the generation of color light by combining WOLED and CF in OLED display screens in the prior art. In addition, since the optical module further comprises an optical element for amplifying and reflecting, the red, blue and green light emitted by the beam splitting prism can be amplified and reflected by the optical module to project the emitted image into the human eyes.

The above is a display panel provided by the disclosure. Based on the display panel, an exemplary embodiment of the disclosure further provides a display device and a head-mounted display device, including the display panel as described above.

Wherein, the display device may be, for example, a micro-display device, but is not limited thereto; as long as it includes an optical module, a blue-light OLED light source module, a red-light OLED light source module and a green-light OLED light source module, and the optical module includes a beam splitting prism; and the blue-light OLED light source module, the red-light OLED light source module and the green-light OLED light source module are arranged at three sides of the beam splitting prism, respectively; and blue light emitted by the blue-light OLED light source module, red light emitted by the red-light OLED light source module and green light emitted by the green-light OLED light source module are emitted through the optical module, which all should be within the protection scope of the disclosure.

The above-mentioned head-mounted display device may be AR glasses, wherein the optical module is arranged on a frame of the AR glasses; the AR glasses include an optical module, a blue-light OLED light source module, a red-light OLED light source module and a green-light OLED light source module, and the optical module includes a beam splitting prism; and blue light emitted by the blue-light OLED light source module, red light emitted by the red-light OLED light source module and green light emitted by the green-light OLED light source module are emitted through the optical module.

The above display device includes the display panel. Further, the display device may be any products or components having a display function, such as AR, VR or MR head-mounted display device. Other components indispensable to the display device should be understood by a person skilled in the art, which are not described in detail herein, nor should be construed as a limitation to the disclosure.

The above description is only exemplary embodiments of the disclosure and is not intended to limit the disclosure. As for a person skilled in the art, there are various modifications and changes in the disclosure. Any equivalent modifications, equivalent substitutions, improvements and the like made within the spirit and principle of the disclosure should be included in the scope of the appended claims of the disclosure.

It should be noted that all technical and scientific terms used herein have the same meaning as commonly understood by a person skilled in the art to which the disclosure pertains, unless otherwise defined. The terminology used herein is for the purpose of describing specific exemplary embodiments, and is not intended to be a limitation to the disclosure. The term "and/or" as used herein includes any and all combinations of one or more of the associated listed items. The terms "vertical", "horizontal", "first", "second", and the like are used herein for the purpose of illustration and are not intended to be the only exemplary embodiment.

What is claimed is:

1. A display panel, comprising:
   an optical assembly, a blue-light OLED light source assembly, a red-light OLED light source assembly and a green-light OLED light source assembly, and the optical assembly comprising a beam splitting prism;
   the blue-light OLED light source assembly, the red-light OLED light source assembly and the green-light OLED light source assembly being arranged at three sides of the beam splitting prism, respectively; and
   blue light emitted by the blue-light OLED light source assembly, red light emitted by the red-light OLED light source assembly and green light emitted by the green-light OLED light source assembly being emitted through the optical assembly,
   wherein each of the blue-light OLED light source assembly, the red-light OLED light source assembly and the green-light OLED light source assembly is a silicon-based OLED,
   wherein the silicon-based OLED comprises a single crystal silicon substrate, an integrated drive circuit located at one side of the substrate and an OLED light-emitting layer located at a side of the integrated drive circuit far away from the substrate.

2. The display panel of claim 1, wherein the optical assembly comprises a plurality of optical elements, and the blue light emitted by the blue-light OLED light source assembly, the red light emitted by the red-light OLED light source assembly and the green light emitted by the green-light OLED light source assembly being emitted through the optical assembly comprises:
   the blue light emitted by the blue-light OLED light source assembly, the red light emitted by the red-light OLED light source assembly and the green light emitted by the green-light OLED light source assembly being aggregated and emitted via a same side of the beam splitting prism, and reflected and amplified by the optical elements and then emitted.

3. The display panel of claim 1, wherein the green-light OLED light source assembly is arranged at a side opposite to light-exiting side of the beam splitting prism, and the blue-light OLED light source assembly and the red-light OLED light source assembly are correspondingly arranged at two sides of the light-exiting side, respectively;
   the light-exiting side emits blue light, red light and green light, respectively.

4. The display panel of claim 1, wherein diagonal lengths of a display area of the blue-light OLED light source assembly, a display area of the red-light OLED light source assembly and a display area of the green-light OLED light source assembly each are less than or equal to 5 cm.

5. A display device, including: a display panel, the display panel comprising: an optical assembly, a blue-light OLED light source assembly, a red-light OLED light source assembly and a green-light OLED light source assembly, and the optical assembly comprising a beam splitting prism;
   the blue-light OLED light source assembly, the red-light OLED light source assembly and the green-light OLED light source assembly being arranged at three sides of the beam splitting prism, respectively;
   blue light emitted by the blue-light OLED light source assembly, red light emitted by the red-light OLED light source assembly and green light emitted by the green-light OLED light source assembly being emitted through the optical assembly,
   wherein each of the blue-light OLED light source assembly, the red-light OLED light source assembly and the green-light OLED light source assembly is a silicon-based OLED,
   wherein the silicon-based OLED comprises a single crystal silicon substrate, an integrated drive circuit located at one side of the substrate and an OLED light-emitting layer located at a side of the integrated drive circuit far away from the substrate.

6. A head-mounted display device, comprising a display panel, the display panel comprising: an optical assembly, a blue-light OLED light source assembly, a red-light OLED light source assembly and a green-light OLED light source assembly, and the optical assembly comprising a beam splitting prism;
   the blue-light OLED light source assembly, the red-light OLED light source assembly and the green-light OLED light source assembly being arranged at three sides of the beam splitting prism, respectively;
   blue light emitted by the blue-light OLED light source assembly, red light emitted by the red-light OLED light source assembly and green light emitted by the green-light OLED light source assembly being emitted through the optical assembly,
   wherein each of the blue-light OLED light source assembly, the red-light OLED light source assembly and the green-light OLED light source assembly is a silicon-based OLED,
   wherein the silicon-based OLED comprises a single crystal silicon substrate, an integrated drive circuit located at one side of the substrate and an OLED light-emitting layer located at a side of the integrated drive circuit far away from the substrate.

7. The head-mounted display device of claim 6, wherein the head-mounted display device is AR glasses;
   the optical assembly is arranged on a frame of the AR glasses.

* * * * *